United States Patent [19]
Patwa

[11] Patent Number: 5,689,454
[45] Date of Patent: Nov. 18, 1997

[54] CIRCUITRY AND METHODOLOGY FOR PULSE CAPTURE

[75] Inventor: Nital Patwa, Plano, Tex.

[73] Assignee: Cyrix Corporation, Richardson, Tex.

[21] Appl. No.: 583,922

[22] Filed: Jan. 11, 1996

[51] Int. Cl.[6] .................................................. G11C 15/00
[52] U.S. Cl. ........................ 365/49; 365/203; 365/189.05
[58] Field of Search ............................ 365/49, 203, 204, 365/205, 189.05; 326/93, 95, 98

[56] References Cited

U.S. PATENT DOCUMENTS

| | | | |
|---|---|---|---|
| Re. 34,026 | 8/1992 | Duvvury et al. | 365/203 |
| 4,141,081 | 2/1979 | Horne et al. | 365/203 |
| 4,764,901 | 8/1988 | Sakurai | 365/203 |
| 5,297,092 | 3/1994 | Johnson | 365/203 |
| 5,315,555 | 5/1994 | Choi | 365/203 |
| 5,408,437 | 4/1995 | Cho et al. | 365/189.05 |
| 5,508,644 | 4/1996 | Branson et al. | 365/189.05 |

*Primary Examiner*—Tan T. Nguyen
*Attorney, Agent, or Firm*—Andrew S. Viger; John L. Maxin

[57] ABSTRACT

Circuitry and methodology for pulse capture employs S-R latch, precharge, and switch circuitries for quickly sensing and capturing a logic pulse from dynamic logic circuitry. The present invention while having general application to any dynamic logic circuitry has particular application to random access memory (RAM), content addressable memory (CAM), and adder circuitries.

2 Claims, 5 Drawing Sheets

CIRCUITRY AND METHODOLOGY FOR PULSE CAPTURE

BACKGROUND OF THE INVENTION

1. Field of the Invention

The invention relates generally to detecting changes in logic levels and more particularly, to circuitry and methodology of capturing a pulse from dynamic logic circuitry.

2. Description of Related Art

Logic circuitry can be broadly categorized into static and dynamic types. Static logic circuitry is characterized in that an active element, such as a MOS transistor, is always pulling an output node to either a logic level high or logic level low. Consequently, the output node is always in a defined state.

Dynamic logic circuitry on the other hand, "precharges" the output node to a logic level high during a first clock phase and during a second clock phase, energizes a selected element to drive the output node with its logic level. Typical dynamic logic circuitry applications include random access memory (RAM) and content addressable memory (CAM).

Reference is now made to FIG. 1 which depicts typical dynamic logic circuitry 10 along with typical latch circuitry 12 for latching the so-called "Bit" input line which is driven during the second clock phase. When clock signal Clk is driven to a logic level low, transistor 14 is turned on—precharging input node 16 to substantially $V_{cc}$ (a logic level high). When clock signal Clk is driven high, transistor 14 is turned off and transistor 18 is turned on—pulling common node 20 to substantially ground.

A plurality of Bit line transistors $22_a$-$22_n$ have their sources coupled to common node 20 and their drains coupled to input node 16. When common node 20 is pulled to substantially ground, Bit line transistors $22_a$-$22_n$ have a path to ground and accordingly, can pull input node 16 to towards a logic level low if one or more of their gates are pulled to a logic level high. However, due to the high loading capacitance of input node 16 from bit line transistors $22_a$-$22_n$, discharge of the bit line is slow and in many applications, the logic level low only approaches ⅓–¼$V_{cc}$ when the clock signal Clk is switches from a high logic level to a low logic level. Latch circuitry 12 includes a pass gate 24, which when the clock signal Clk is a logic level high, passes the signal on input node 16 to input zz on a pair of cross-coupled inverters $26_a$ and $26_b$ to latch the value on the Bit line.

A drawback with the circuitry of FIG. 1 is best understood with further reference to the timing diagram illustrated in FIG. 2. The signal on the Bit line in FIG. 2 is depicted as being pulled to a logic low level by one of the bit line transistors $22_a$-$22_n$ to a value of approximately ⅓–¼$V_{cc}$ then slowly rising (due to the loading of transistors $22_a$-$22_n$) towards $V_{cc}$. The latch circuitry 12 is therefore presented with a "poor" logic level low. The pass gate 24, which is controlled by both Clk and $\overline{Clk}$ signals, finally closes at point 29—latching the value on node zz. Since the value on node zz is neither a "hard" logical one or zero, both P and N channel devices within the cross-coupled inverters $26_a$ and $26_b$ are partially turned-on—consuming excessive quiescent (static) current—thus reducing available drive current on the output. Additionally, there is a possibility that PMOS transistor 14 could be biased so as to lift up the voltage level on input node 16 above the threshold of inverter $26_a$—causing latch circuitry 12 to capture the incorrect value.

In an improved, but not entirely satisfactory technique, jumper 17 is removed and inverter 25 is inserted between input node 16 and the commonly connected drains of transistors $22_a$-$22_n$. Inverter 25 amplifies the Bit signal to produce a strong $\overline{Bit}$ signal which swings substantially between $V_{cc}$ and ground. Ostensibly however, inverter 25 also induces an inversion. To nullify the inversion, jumper 31 is removed and inverter 27 is inserted between cross-coupled inverters $26_a$ and $26_b$ and the output. Inverter 27 however, also induces an additional gate delay in the data path between the Bit line and the output—which in high speed applications, such as RAMs and CAMs, slows down the operation and therefore is unacceptable.

Accordingly, it can be seen from the foregoing, that there is a need for improved circuitry and methodology for pulse capture that does not consume excessive static power, is immune to race conditions, and provides either an inverting or a non-inverting latch without inducing additional gate delays.

SUMMARY OF THE INVENTION

To overcome the limitations of the prior art described above, and to overcome other limitations that will become apparent upon reading and understanding the present specification, the present invention discloses circuitry and methodology for pulse capture employing an S-R latch, precharge, and switch circuitries, to quickly sense and capture a logic pulse from dynamic logic circuitry. The present invention has general application to any dynamic logic circuitry but has particular application to random access memory (RAM), content addressable memory (CAM), and adder circuitries.

A feature of the present invention is the ability to quickly capture a pulse from dynamic logic circuitry without consuming excessive static power.

Another feature of the present invention is providing a latch which is immune to race conditions.

Yet another feature of the present invention is providing an inverting latch in the data path without incurring additional delays.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of circuitry and methodology for pulse capture in accordance with the principles of the present invention.

DESCRIPTION OF THE PREFERRED EMBODIMENTS

Figure 1:
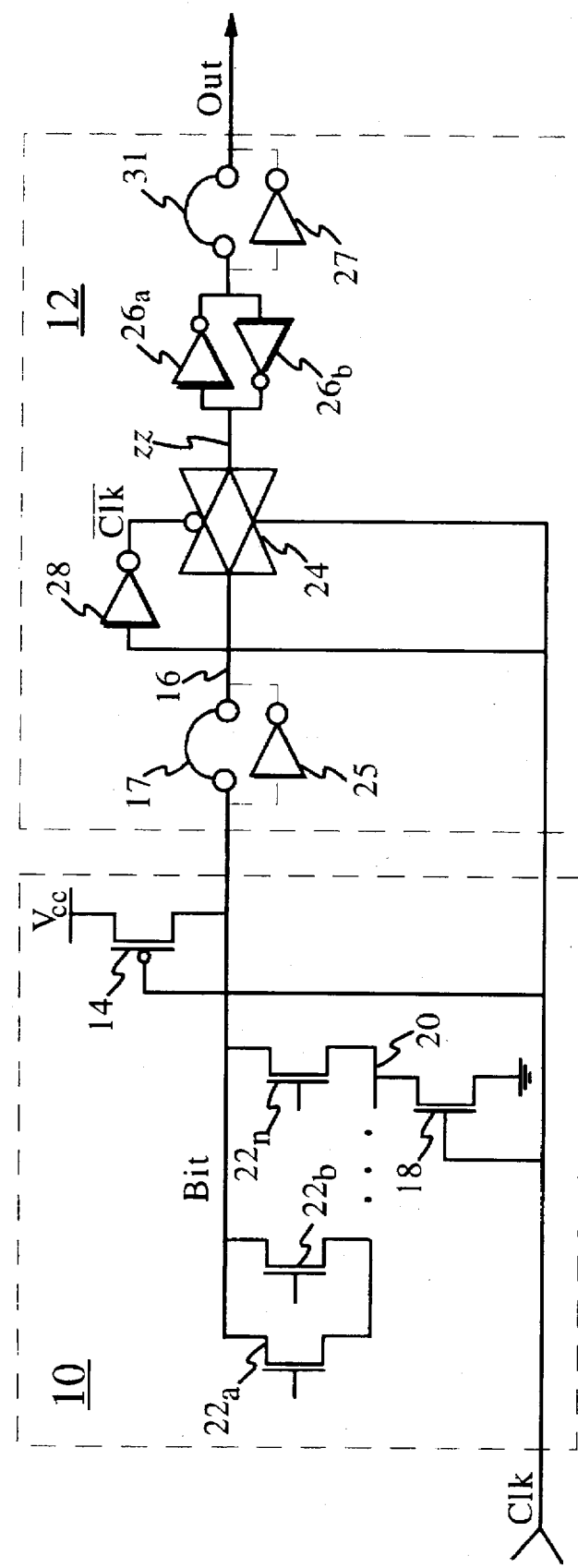
FIG. 1 is a schematic diagram of prior art circuitry for capturing a pulse from dynamic logic circuitry.
Figure 2:
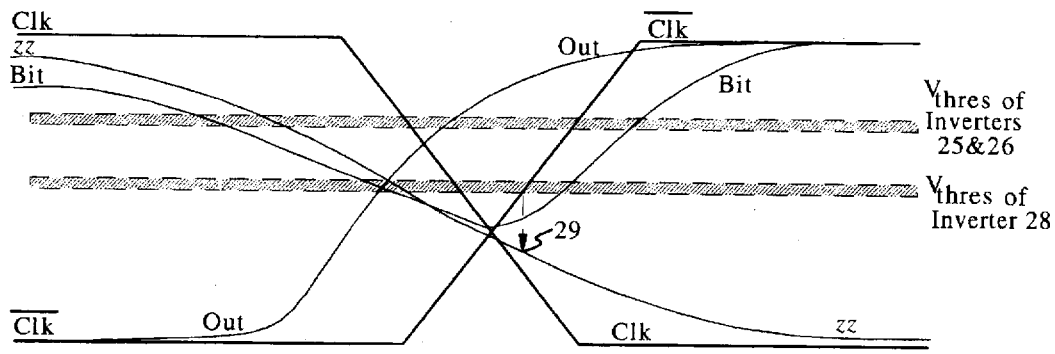
FIG. 2 is a timing diagram of signals generated in the circuitry depicted in FIG. 1.

The detailed description of the preferred embodiments for the present invention is organized as follows:
1. Exemplary Circuitry And Methodology For Pulse Capture
2. Dual-ended RAM Application
3. Content Addressable Memory Application
4. Adder Application
5. Conclusion This organizational table, and the corresponding headings used in this detailed description, are provided for the convenience of reference only and are not intended to limit the scope of the present invention. In order not to obscure the disclosure with structural details which will be readily apparent to those skilled in the art having the benefit of the description herein, the structure, control, and arrangement of conventional circuits have been illustrated in the drawings by readily understandable block representations, schematic and timing diagrams, showing and describing details that are pertinent to the present invention. Thus, the block diagram and schematic illustrations in the figures do not necessarily represent the physical arrangement of the exemplary system, but are primarily intended to illustrate the major structural components in a convenient functional grouping, wherein the present invention may be more readily understood.

Reference is now made to the accompanying drawings which form a part hereof, and in which is shown by way of illustration specific embodiments in which the invention may be practiced. It is to be understood that other embodiments may be utilized and structural changes may be made without departing from the scope of the present invention.

1. Exemplary Circuitry And Methodology For Pulse Capture

Figure 3:
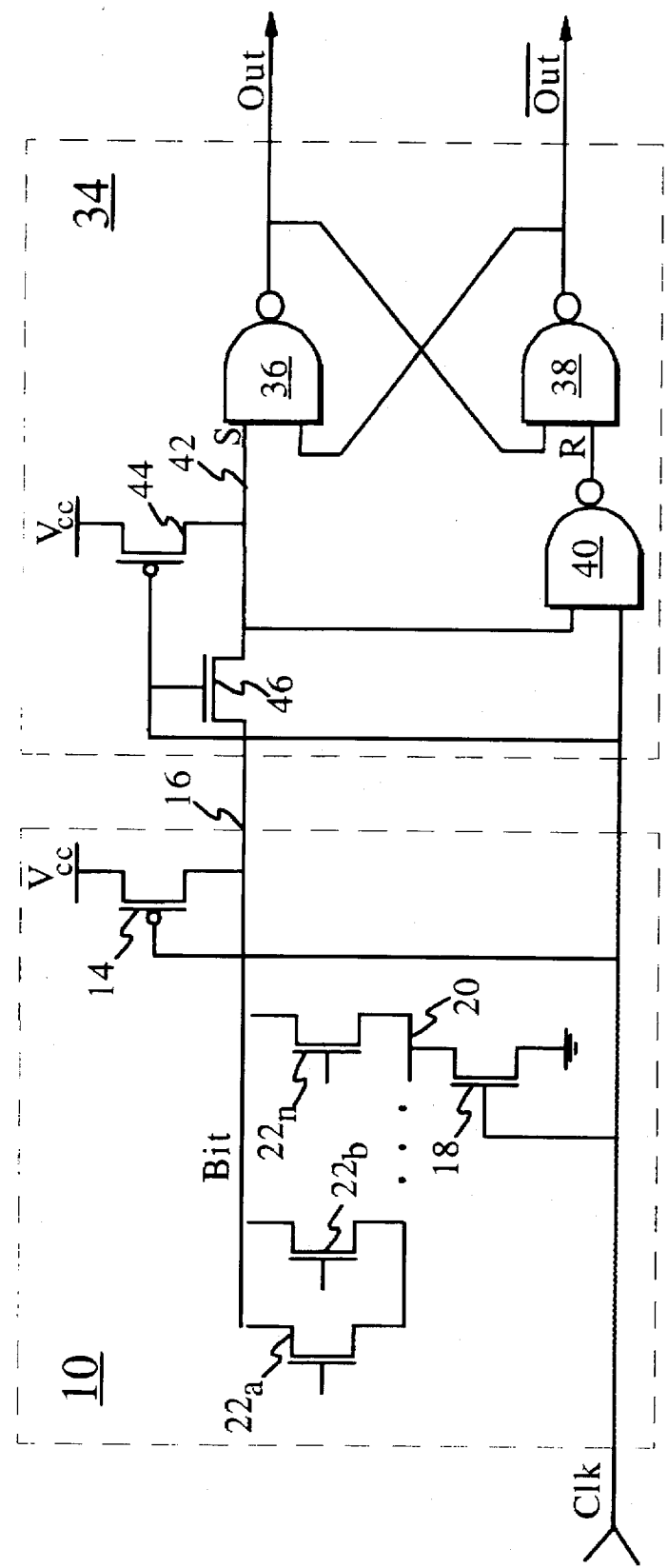
FIG. 3 is a schematic diagram of circuitry to capture a pulse from dynamic logic circuitry, practiced in accordance with the principles of the present invention.

Reference is now made to FIG. 3 which depicts a schematic diagram of latch circuitry 34 and methodology of capturing a pulse from the dynamic logic circuitry 10, practiced in accordance with the principles of the present invention. Latch circuitry 34 includes a first NAND gate 36 having its output coupled to a first input on a second NAND gate 38. The second NAND gate 38 has its output coupled to a first input on a first NAND gate 36. A second input on second NAND gate 38 is coupled to an output of a third NAND gate 40. A second input on first NAND gate 36 is coupled to node 42 which couples together the drains of P-channel transistor 44 and N-channel transistor 46, and a first input to third NAND gate 40. A second input to NAND gate 40 is coupled to receive a clock signal on a Clk line which may be generated by any means, the exact details not being necessary for the understanding of the present invention. The Clk line is also coupled to the gates of transistors 44 and 46. The second inputs to NAND gates 36 and 38 are Set (S) and Reset (R) latch inputs, respectively. The output line (Out) of NAND gate 36 has a signal representative of a latched signal from the Bit line. The complimentary output line ($\overline{Out}$) of NAND gate 38 has a signal representative of a latched complimentary Bit line.

The input node 16 to latch circuitry 34 is coupled to the source of N-channel transistor 46. When any one of the plurality of Bit line transistors $22_a$–$22_n$ have their gates pulled to a logic level high and the Clk line is pulled to a logic level high, the source Of N-channel transistor 46 is pulled to ground through transistor 18. Accordingly when the Clk line is high, transistor 46 conducts also pulling node 42 to ground (logic level low). A logic level low on the S input to NAND gate 36 forces the Out line to a logic level high. Likewise, a logic level low on the first input to NAND gate 40 forces the R input to NAND gate 38 high.

Figure 4:
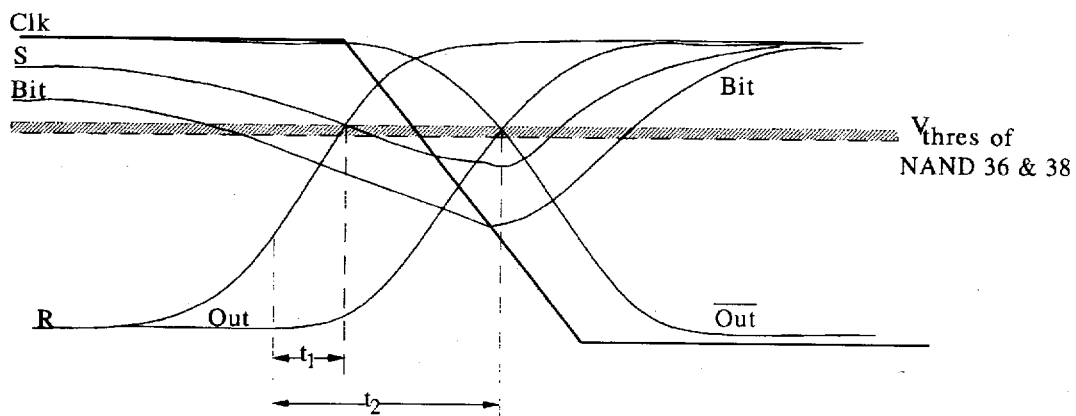
FIG. 4 is a timing diagram of signals generated in the circuitry depicted in FIG. 3.

Referring now to FIG. 4, rise time h of the R input is much faster than rise time $t_2$ of the Out line due to lower capacitive loading. As both the R input and the Out line of NAND gate 38 rise to a high logic level, the $\overline{Out}$ line drops towards a logic level low. The logic level low of $\overline{Out}$ line, which is coupled to the first input of NAND gate 36, reinforces the low input to NAND gate 36 and prevents further static power dissipation in NAND gate 36. When the Clk line returns to a logic level low, transistor 46 is turned off and transistor 44 turned on —pulling node 42 to a logic level high. However, since $\overline{Out}$ is still holding a logic level low, Out remains high, thus capturing the logic level low on the S input. Accordingly, the latch circuitry 34 provides both an inverting and noninverting latch, reduces static power dissipation, and provides race immunity through the reinforcing action of the feedback loop formed by NAND gates 36 and 38.

2. Dual-ended RAM Application

Figure 5:
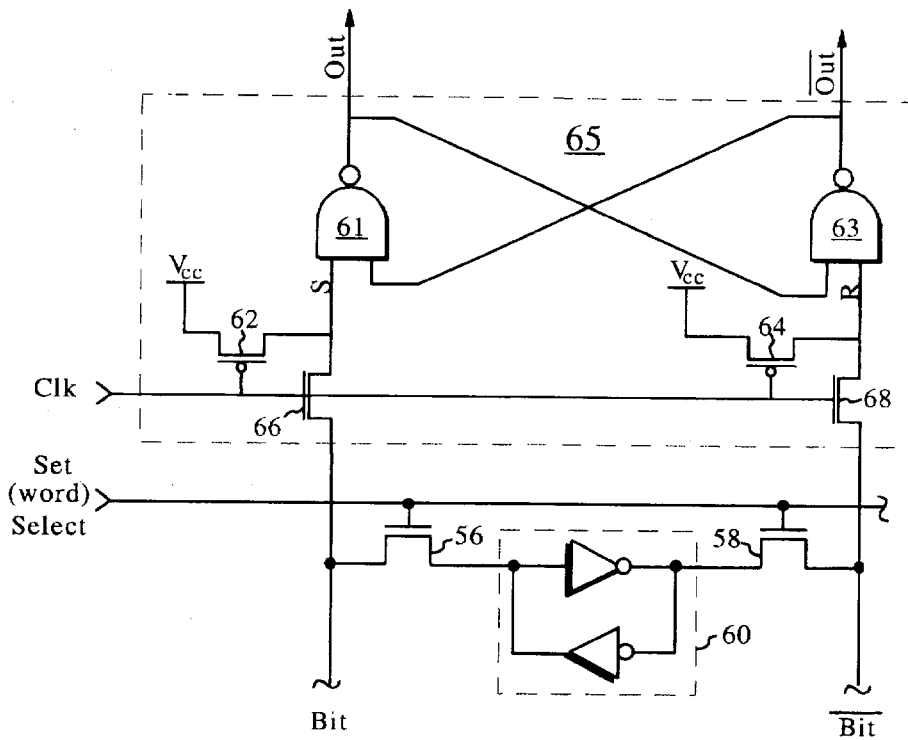
FIG. 5 is a schematic diagram of a first preferred application of the present invention for use in a dynamic random access memory.

Reference is now made to FIG. 5 which depicts application of the present invention to a RAM cell. It should be understood that other circuits can be used for the RAM cell without departing from the scope of the present invention. When pulled to a logic level high, the set (word) select line enables transistors 56 and 58 to allow latch 60 to be programmed with the data residing on the Bit and $\overline{Bit}$ lines. When Clk line is low, the S and R inputs to NAND gates 61 and 63 respectively, are precharged to $V_{cc}$ by turning on P-channel transistors 62 and 64. When Clk line goes high, P-channel transistors 62 and 64 are turned off and transistors 66 and 68 are turned on—pulling the S and R inputs to the logic levels on the Bit and $\overline{Bit}$ lines, respectively.

If Bit line is high, the S input to NAND gate 61 is asserted and the Out line is latched high. Conversely, if $\overline{Bit}$ line is high, the R input to NAND gate 63 is asserted and the Out line is latched low. It is to be understood that while only one memory cell is depicted for clarity, a practical memory has a plurality of mutually exclusive cells disposed between the Bit and $\overline{Bit}$ lines and has multiple Bit lines—the number depending on the word length.

3. Content Addressable Memory Application

Figure 6:
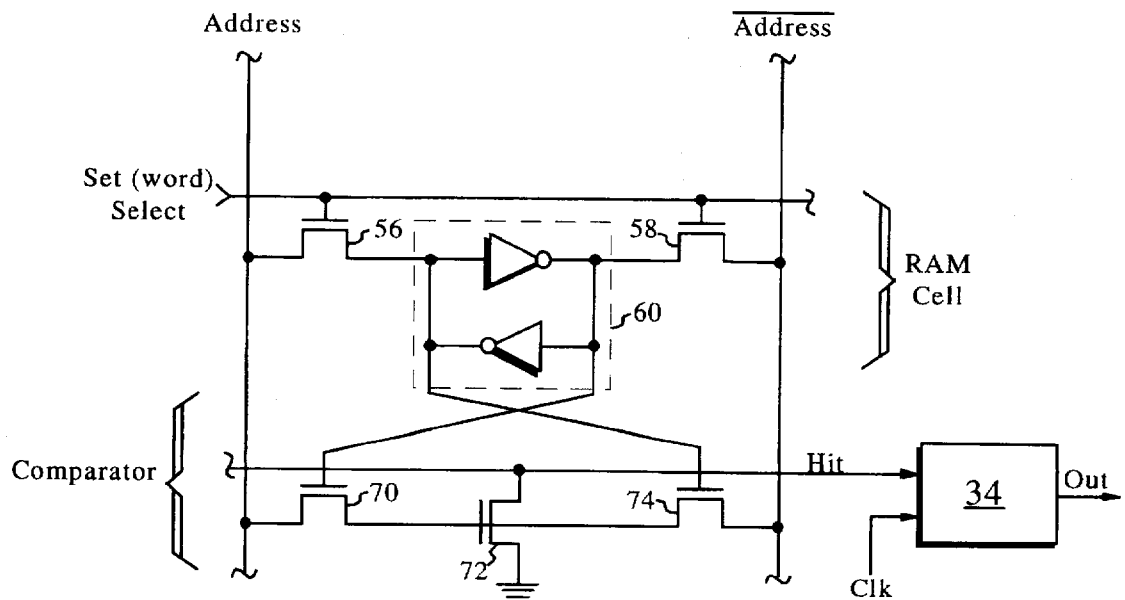
FIG. 6 is a schematic diagram of a second preferred application of the present invention for use in a content addressable memory; and, FIG. 7 is a schematic diagram of a third preferred application of the present invention for use with adder circuitry.

Reference is now made to FIG. 6 which depicts application of the present invention to an exemplary CAM cell. It should also be understood that other circuits can be used for the CAM cell without departing from the scope of the present invention. The CAM cell functions similar to the RAM cell of FIG. 6 except for the addition of transistors 70, 72, and 74, the omission of the dual-ended S-R latch circuitry 65, and the addition of latch circuitry 34. If the data latched by latch 60 matches the data driven onto the Address and $\overline{Address}$ lines, then transistors 70 and 74 do not conduct and transistor 72 remains off thus not pulling the "hit" line low. Otherwise if the address does not match the data in the latch 60, either transistor 70 or 74 conducts turning on transistor 72—pulling the hit line low—indicating no match. In lieu of the dynamic circuitry 10, the hit line is coupled to node 16 of latch circuitry 34 in FIG. 3.

4. Adder Application

Figure 7:
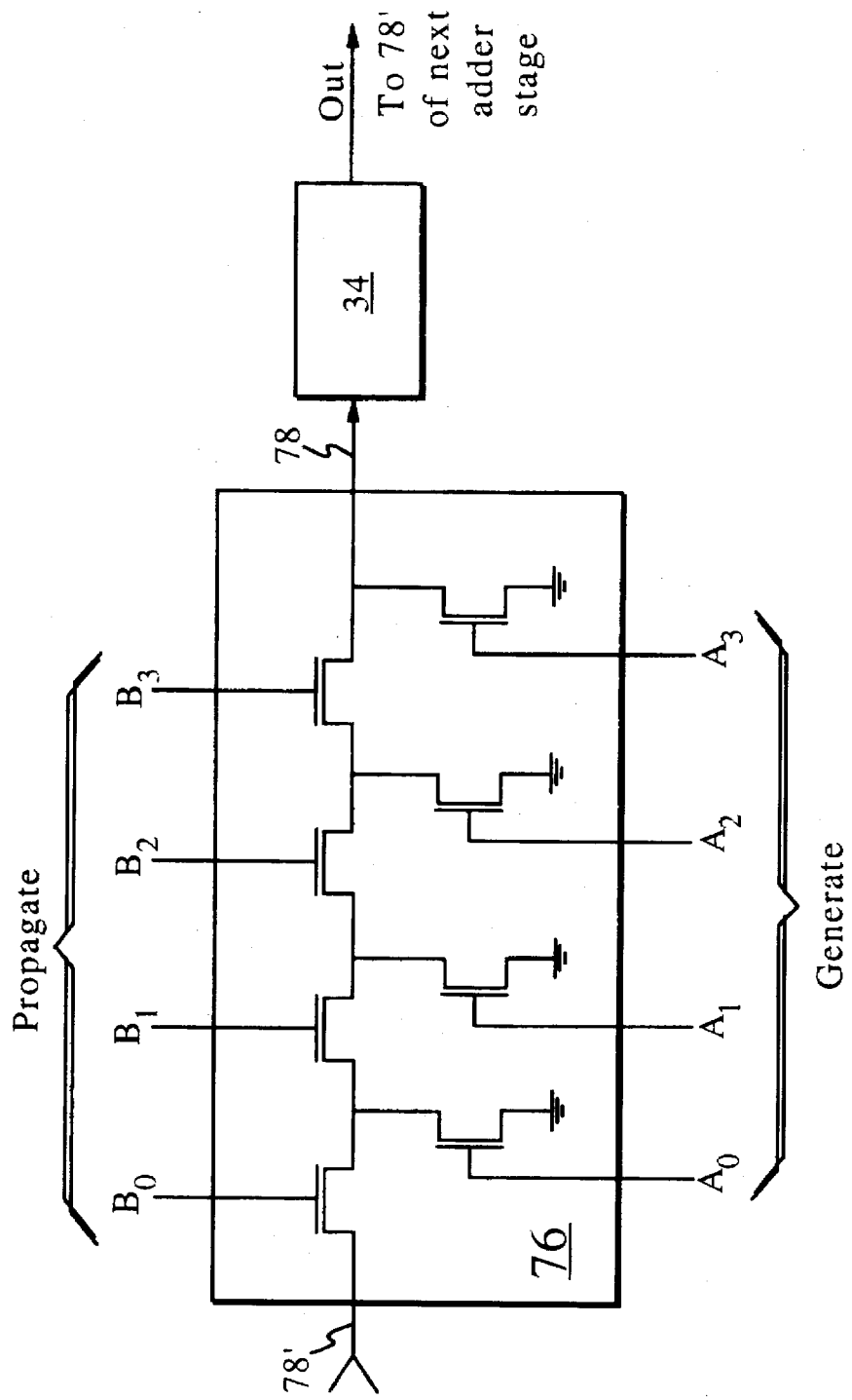

Reference is now made to FIG. 7 which depicts application of the present invention to adder circuitry 76. Adder circuitry 76 is depicted as being nibble wide, however, the exact details are not important for the understanding of the present invention. It is sufficient to understand that adder circuitry 76 receives a plurality of propagate inputs (e.g. $B_0$–$B_3$), a plurality of generate inputs (e.g. $A_0$–$A_3$), a carry-forward bit on line 78, and potentially generates a carry-out bit on carry-out line 78. Multiple adder circuitries are concatenated together to form a requisite word size. Interposed between the carry-out line 78 and the carry-forward line 78' is latch circuitry 34.

5. Conclusion

Although the Detailed Description of the invention has been directed to certain exemplary embodiments, various modifications of these embodiments, as well as alternative embodiments, will be suggested to those skilled in the art. Particularly however, the present invention has broad application for capturing pulses in all dynamic logic circuitry. The invention encompasses any modifications or alternative embodiments that fall within the scope of the claims.

What is claimed is:

1. A content addressable memory comprising:
   (a) at least one memory cell coupled between an address line and a complementary address line;
   (b) a comparator coupled to the at least one memory cell and the address line and the complementary address line, and having a hit output to indicate a match between contents of the at least one memory cell and levels driven on the address line and the complementary address line;
   (c) a latch having set and reset inputs;
   (d) an input switch to couple the hit output to the latch during a second clock phase; and,
   (e) a precharge circuit to precharge the set and reset inputs of latch (c) during a first clock phase.

2. Adder circuitry comprising:
   (a) at least one adder having a plurality of generate inputs, a plurality of propagate inputs, a carry-in input, and a carry-out output;
   (b) a latch having set and reset inputs;
   (c) an input switch to couple the carry-out output to the latch during a second clock phase; and,
   (d) a precharge circuit to precharge the set and reset inputs of latch (b) during a first clock phase.

* * * * *